United States Patent
Harris et al.

(10) Patent No.: US 7,494,900 B2
(45) Date of Patent: Feb. 24, 2009

(54) BACK SIDE WAFER DICING

(75) Inventors: Richard S. Harris, Portland, OR (US); Ho W. Lo, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 139 days.

(21) Appl. No.: 11/441,453

(22) Filed: May 25, 2006

(65) Prior Publication Data

US 2007/0275541 A1 Nov. 29, 2007

(51) Int. Cl.
*H01L 21/00* (2006.01)
(52) U.S. Cl. .................. 438/460; 438/381; 438/106; 438/113; 257/E43.001
(58) Field of Classification Search .................. 438/460
See application file for complete search history.

(56) References Cited

U.S. PATENT DOCUMENTS

| | | | |
|---|---|---|---|
| 6,066,562 A | 5/2000 | Ohshima et al. | |
| 6,465,158 B1* | 10/2002 | Sekiya | 430/313 |
| 6,676,878 B2 | 1/2004 | O'Brien et al. | |
| 6,998,571 B2* | 2/2006 | Sekiya et al. | 219/121.67 |
| 2002/0033558 A1 | 3/2002 | Fahey et al. | |
| 2002/0149136 A1 | 10/2002 | Baird et al. | |
| 2004/0188699 A1* | 9/2004 | Kameyama et al. | 257/99 |
| 2004/0211762 A1* | 10/2004 | Sekiya et al. | 219/121.82 |
| 2005/0054179 A1 | 3/2005 | Nagai | |
| 2005/0260829 A1 | 11/2005 | Uematsu et al. | |
| 2006/0154385 A1* | 7/2006 | Aggarwal | 438/14 |

OTHER PUBLICATIONS

Search Report and Written Opinion Concerning the Corresponding International Application No. PCT/US2007/069217.

* cited by examiner

*Primary Examiner*—Walter L Lindsay, Jr.
*Assistant Examiner*—Abdulfattah Mustapha
(74) *Attorney, Agent, or Firm*—Stoel Rives LLP

(57) ABSTRACT

Systems and methods for scribing a semiconductor wafer with reduced or no damage or debris to or on individual integrated circuits caused by the scribing process. The semiconductor wafer is scribed from a back side thereof. In one embodiment, the back side of the wafer is scribed following a back side grinding process but prior to removal of back side grinding tape. Thus, debris generated from the scribing process is prevented from being deposited on a top surface of the wafer. To determine the location of dicing lanes or streets relative to the back side of the wafer, the top side of the wafer is illuminated with a light configured to pass through the grinding tape and the wafer. The light is detected from the back side of the wafer, and the streets are mapped relative to the back side. The back side of the wafer is then cut with a saw or laser.

31 Claims, 6 Drawing Sheets

BACK SIDE WAFER DICING

TECHNICAL FIELD

This application relates to processing a wafer and, in particular, to a method and/or system for dicing a wafer from the back side thereof.

BACKGROUND INFORMATION

Integrated circuits (ICs) are generally fabricated in an array on or in a semiconductor substrate. For example, FIG. 1 is a perspective view of a typical semiconductor wafer 100 having a plurality of ICs 110 formed thereon. The ICs 110 are separated by dicing lines or streets 112 that form a lattice pattern on a top surface of the semiconductor wafer 100.

The ICs 110 are singulated by mounting the back side of the semiconductor wafer 100 on a tape frame (not shown) and cutting along the streets 112 formed on the top surface of the semiconductor wafer 100. Cutting is generally carried out by a cutting machine called a dicer that includes a chuck table for holding the semiconductor wafer 100 and a mechanical saw or laser for cutting the semiconductor wafer 100. Mechanical saws generally include a rotary spindle and a cutting blade mounted on the spindle. The cutting blade may include, for example, a disk-like base and an annular cutting edge fitted to the outer peripheral portion of the side surface of the base. The cutting edge generally includes diamond abrasive grains.

The streets 112 are generally visible from the top side of the semiconductor wafer 100. Thus, from the top side of the semiconductor wafer 100, the mechanical saw or laser may be guided along the streets 112 to cut the semiconductor wafer 100 into individual ICs. The tape frame, also referred to as dicing tape, holds the ICs 110 in place during and after the dicing process. However, the top surface of the ICs 110 are left unprotected during the dicing process and may be damaged by the mechanical saw or laser. For example, metals, low-k dielectrics, or other materials formed in the streets 112 on the top surface of the semiconductor wafer 100 can damage the ICs 110 and/or the mechanical saw.

FIG. 2 is an enlarged top view of the semiconductor wafer 100 shown in FIG. 1 illustrating metal features 210, 212 formed in the streets 112 on the top surface of the wafer. The metal features 210, 212 may include, for example, coupons or test circuits used during the manufacturing process and sacrificed when the semiconductor wafer 100 is diced. A test circuit may include, for example, a metal pattern called a test element group (Teg) applied over the semiconductor substrate 100. The metal features 210, 212 tend to clog or otherwise damage diamond impregnated saws typically used in the dicing process. Mechanical sawing produces burrs because a Teg, for example, is generally made of a soft metal such as copper or the like. In addition, as thinner wafers are produced, mechanical saws cause more edge chipping. Thus, yield (e.g., the number of functioning ICs produced from the wafer) decreases.

Laser dicing can also damage the ICs 110 and reduce yield. Instead of using a traditional saw blade, a laser beam is focused onto the top surface of the semiconductor wafer 100 to thereby "cut" the semiconductor wafer 100 into the individual ICs 110. The process of laser dicing generates excessive heat and debris. The heat can cause heat affected zones and recast oxide layers. Cracks may form in the heat affected zones and reduce the die break strength. Further, the debris produced by lasers is molten in one state and can be very difficult to remove. Sacrificial coatings can be used to protect the top surface of the ICs 110 from debris during laser dicing. The sacrificial coating must then be removed after the dicing process. Another process uses a water jet in conjunction with the laser. The water jet washes the debris away during the dicing process. However, sacrificial coatings and water jet or other cleaning processes add time and expense to the overall dicing process.

Therefore, a method of dicing finished semiconductor wafers that increases throughput and yield is desirable.

SUMMARY OF THE DISCLOSURE

The embodiments disclosed herein provide systems and methods for scribing a semiconductor wafer with reduced or no damage or debris to a top surface of the semiconductor wafer caused by the scribing process. The semiconductor wafer is scribed from a back side thereof. In one embodiment, the back side of the wafer is scribed following a back side grinding process but prior to removal of back side grinding tape. Thus, debris generated from the scribing process is prevented from being deposited on a top surface of the wafer.

Currently, wafers are diced from the top side primarily because the dicing lanes or streets are visible only from the top surface. Thus, a cutting tool (e.g., a laser or a saw) must be aligned to these cutting lanes or streets from the top side of the wafer. In one embodiment, an infrared light source is used to illuminate the wafer from the front side thereof to allow alignment of the cutting tool to the dicing lanes or streets from the back side of the wafer. Advantageously, dicing from the back side prevents or reduces chipping, cracking, and/or laser generated debris from depositing on the top surface of the wafer.

According to the foregoing, in one embodiment, a method is provided for cutting a semiconductor wafer having a plurality of integrated circuits formed on or in a top surface thereof. The integrated circuits are separated by one or more streets visible from the top surface of the semiconductor wafer. The method includes illuminating the top surface of the semiconductor wafer with a light. A portion of the light passes through the one or more streets to a bottom surface of the semiconductor wafer. The method also includes imaging the portion of the light passing from the bottom surface of the semiconductor wafer so as to determine a location of the one or more streets relative to the bottom surface of the semiconductor wafer. After the location of the streets are determined, a portion of the bottom surface of the semiconductor wafer is cut corresponding to the location of the one or more streets.

In another embodiment, a method of manufacturing integrated circuits is provided. The method includes forming multiple electronic circuit components on or in a top surface of a semiconductor wafer. The electronic circuit components are separated by one or more streets. The method also includes covering the electronic circuit components with a protective layer and removing a portion of the semiconductor wafer from a first bottom surface thereof to form a second bottom surface of the semiconductor wafer. The second bottom surface of the semiconductor wafer is then imaged to determine a location of the one or more streets relative to the second bottom surface. Then, a portion of the second bottom surface is cut corresponding to the location of the one or more streets.

In another embodiment, a system is provided for cutting integrated circuits. The system includes a light source configured to illuminate a top surface of a wafer, an imaging device configured to generate image data corresponding to light from the light source that passes from the top surface of the wafer to a bottom surface of the wafer, and a processor configured to process the image data so as to map a location of a cutting lane on the top surface of the wafer to the bottom surface of the wafer.

In another embodiment, a system is provided for cutting integrated circuits. The system includes means for mapping a location of a cutting lane along a surface of the wafer, the cutting lane not visible from the surface of the wafer, and means for cutting the surface of the substrate along a path corresponding to the cutting lane.

Additional aspects and advantages will be apparent from the following detailed description of preferred embodiments, which proceeds with reference to the accompanying drawings.

DETAILED DESCRIPTION OF PREFERRED EMBODIMENTS

Figure 1:
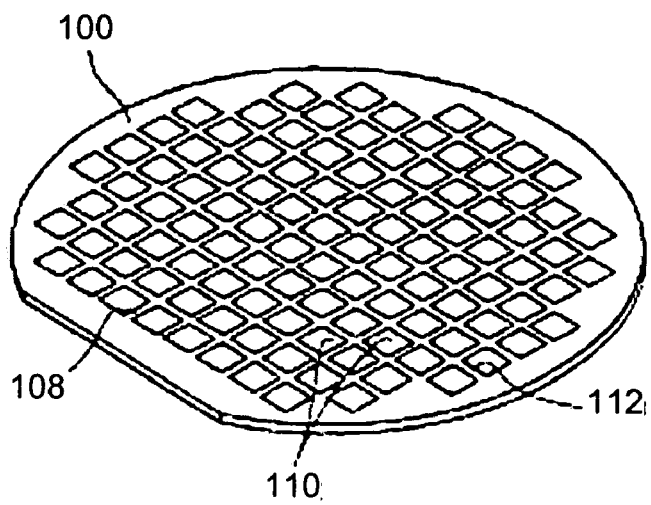
FIG. 1 is a perspective view of a typical semiconductor wafer having a plurality of ICs formed thereon.
Figure 2:
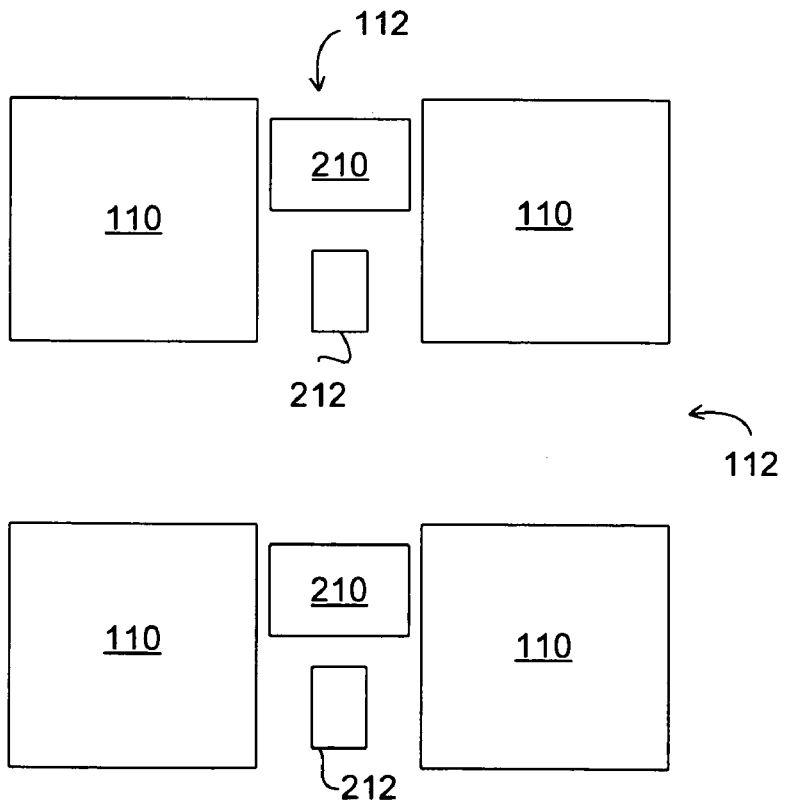
FIG. 2 is an enlarged top view of the semiconductor wafer shown in FIG. 1 illustrating metal features formed in the streets on the top surface of the wafer.

To avoid cutting metal features (e.g., test circuits) or other materials such as low-k dielectrics formed on a top surface of a semiconductor wafer, certain embodiments disclosed herein provide systems and methods for cutting the back side of the semiconductor wafer. The back side of the semiconductor surface is also referred to herein as the "bottom" or "bottom surface" and is generally on an opposite surface from the front or top surface where ICs and dicing lines or streets are formed.

For convenience, the term cutting may be used generically to include trenching (cutting that does not penetrate the full depth of a target work piece) and throughcutting, which includes slicing (often associated with wafer row separation) or dicing (often associated with part singulation from wafer rows). Slicing and dicing may be used interchangeably in the context of this disclosure.

As discussed above, the streets are generally visible from the top surface of the semiconductor wafer. However, the streets are not visible from the back side of the semiconductor wafer. Thus, according to one embodiment, the top surface of the semiconductor wafer is illuminated with a wavelength of light that pass through the semiconductor wafer and be detected from the back side thereof. As discussed in detail below, in one embodiment, the light is provided by a diffuse infrared (IR) light source. The detected light is used to map the streets relative to the back side. The back side is then cut at locations corresponding to the mapped streets.

In one embodiment, the back side of the semiconductor wafer is cut as part of a wafer thinning process. To reduce the thickness of ICs, semiconductor wafers are thinned after device fabrication and before dicing for individual packaging. Back side grinding is a conventional method for reducing silicon wafers from their original thickness to a diminished thickness suitable for final packaging. Grinding the back surface of the semiconductor wafer is fast and produces good total thickness variation and surface finish. Reducing the thickness of the semiconductor wafer generally improves cooling of the device after packaging.

The process of thinning wafers is performed after the ICs have been formed on the top surface of the semiconductor wafer. Back side grinding tape is applied to the top surface of the semiconductor wafer to protect the ICs. The semiconductor wafer then goes into a grinding machine and the back surface is ground away until a desired thickness is achieved. In conventional processes, the back side grinding tape is then removed and the back surface of the semiconductor wafer is mounted on a tape frame. Thus, the top surface of the semiconductor wafer is exposed and cut using a mechanical saw or laser.

However, according to certain embodiments disclosed herein, the back side grinding tape is left in place over the top surface of the semiconductor wafer during the cutting process. Thus, after grinding the back side, the grinding tape acts as a dicing tape to protect and hold the ICs in place while the back side of the semiconductor surface is cut. After dicing, the individual ICs can then be peeled from the grinding tape for packaging. An artisan will recognize from the disclosure herein that an individual die picked from the grinding tape may need to be flipped before being placed for packaging. Because the grinding tape is not removed from the top surface and a dicing tape is not applied to the back side of the wafer before dicing, fewer steps are used in the overall IC fabrication process. Thus, throughput is increased. Further, cutting the back side of the semiconductor wafer reduces damage to the ICs and increases yield. In one embodiment, however, the back side of the semiconductor wafer is placed on a tape frame after cutting the backside of the semiconductor wafer. The grinding tape is then removed from the top surface of the semiconductor and the tape in the tape frame is stretched to allow picking and placing of an individual die. In such an embodiment, the individual die does not need to be flipped after being picked from the tape and before being placed for packaging.

Reference is now made to the figures in which like reference numerals refer to like elements. For clarity, the first digit of a reference numeral indicates the figure number in which the corresponding element is first used. In the following description, numerous specific details are provided for a thorough understanding of the embodiments of the invention. However, those skilled in the art will recognize that the invention can be practiced without one or more of the specific details, or with other methods, components, or materials. Further, in some cases, well-known structures, materials, or operations are not shown or described in detail in order to avoid obscuring aspects of the invention. Furthermore, the described features, structures or characteristics may be combined in any suitable manner in one or more embodiments.

Figure 3:
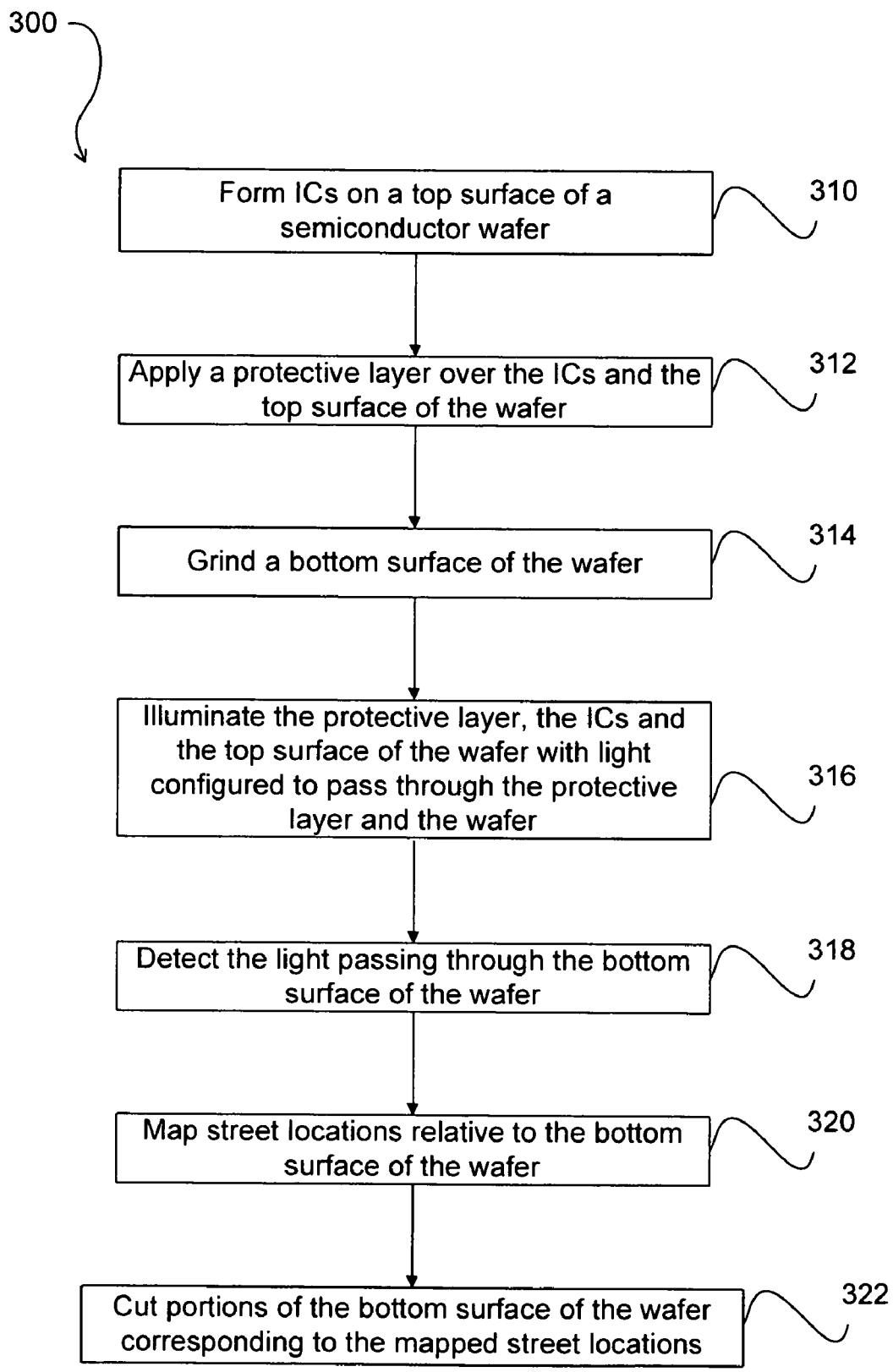
FIG. 3 is a flowchart illustrating a process for manufacturing ICs according to an embodiment of the invention.

FIG. 3 is a flowchart illustrating a process 300 for manufacturing ICs according to one embodiment. At a step 310, the process 300 includes forming ICs on a top surface of a semiconductor wafer. The ICs include one or more layers formed using known semiconductor IC manufacturing processes. As discussed above with respect to FIG. 1, the ICs are separated by streets that form a lattice pattern on the top surface of the wafer.

At a step 312, a protective layer is formed over the ICs and the top surface of the wafer. In one embodiment, the protective layer includes conventional back side grinding tape. The protective layer is configured to protect the ICs during subsequent processing steps and to hold the ICs in place after the wafer is cut. At a step 314, the wafer is thinned by grinding its bottom surface using, for example, a grinding machine.

After the bottom surface is ground away to a desired thickness, the protective layer, the ICs and the top surface of the wafer are illuminated, at a step 314, with light configured to pass through the protective layer and the semiconductor wafer. Thus, the protective layer and the semiconductor wafer are at least partially transparent to the wavelength of the light. The wavelength is selected so as to provide the desired transparency while still providing sufficient resolution to detect the streets. The light is diffuse so as to flood a portion of the top surface within the field of view of an imaging device (discussed below). Further, the intensity of the light is configured to provide a sufficient number of photons in the flooded area so as to satisfy the sensitivity threshold of the imaging device.

At a step 318, the light passing through the bottom surface of the wafer is detected using an imaging device. The imaging device may include, for example, a CCD or CMOS imager configured to detect the wavelength of the light. The field of view of the imaging device is set so as to provide sufficient resolution so as to detect the streets. In one embodiment, the field of view of the imaging device is substantially matched to the area illuminated by the light. To achieve the desired resolution, the field of view of the imaging device may be substantially less than the area of the bottom surface of the wafer. Thus, the imaging device is scanned across the bottom surface of the wafer and the scanned images are combined to generate the overall image.

At a step 320, the detected light is used to map the street locations relative to the bottom surface of the wafer. In one embodiment, the street locations are mapped by imaging the bottom surface and using pattern recognition to determine which portions of the overall image correspond to an image of a street. In one embodiment, the pattern recognition includes techniques used to recognize patterns in aerial photographs. For example, a Hough transform technique may be used that determines whether line segments in different portions of the image are part of a longer straight line forming a street. In another embodiment, a user maps the street locations by visually locating the street locations on an image created by the imaging device and entering the street locations into a computer. The entered street locations are then used to generate a scribe map for subsequent cutting of the bottom surface of the wafer.

In a step 322, the process includes cutting portions of the bottom surface of the wafer corresponding to the mapped street locations. The bottom surface may be cut with a mechanical saw or a laser. In certain embodiments, the semiconductor wafer is scribed without cutting all the way through the wafer so as to avoid contact between a mechanical saw blade and any test devices or other structures above the top surface of the wafer. Thus, damage to the ICs and/or the saw is eliminated or reduced during the dicing process. After scribing the back side of the wafer, the wafer can be broken or otherwise diced along the scribed lines and individual ICs can be removed from the back side grinding tape for packaging. An artisan will recognize from the disclosure herein that an individual die picked from the grinding tape may need to be flipped before being placed for packaging.

In one embodiment, the back side of the semiconductor wafer is placed on a tape frame after cutting the backside of the semiconductor wafer. The grinding tape is then removed from the top surface of the semiconductor and the tape in the tape frame is stretched to allow picking and placing of an individual die. In such an embodiment, the individual die does not need to be flipped after being picked from the tape and before being placed for packaging.

By way of example, FIGS. 4A-4G are side view schematics of a portion of an exemplary semiconductor work piece 400 that is thinned and cut according to the process 300 shown in FIG. 3. The work piece 400 includes a silicon wafer 410 having a top surface 412 and a first bottom surface 414. A plurality of layers 416, 418 are formed on the top surface 412. As an artisan will recognize, the layers 416, 418 may include interconnect layers and insulation layers that form electronic circuitry. For example, the layers 416, 418 may include materials such as Cu, Al, $SiO_2$, SiN, fluorosilicated glass (FSG), organosilicated glass (OSG), SiOC, SiOCN, and other materials used in IC manufacture. For illustrative purposes, two layers 416, 418 are shown. However, an artisan will recognize that fewer or more layers can be used for particular ICs.

Figure 4A:
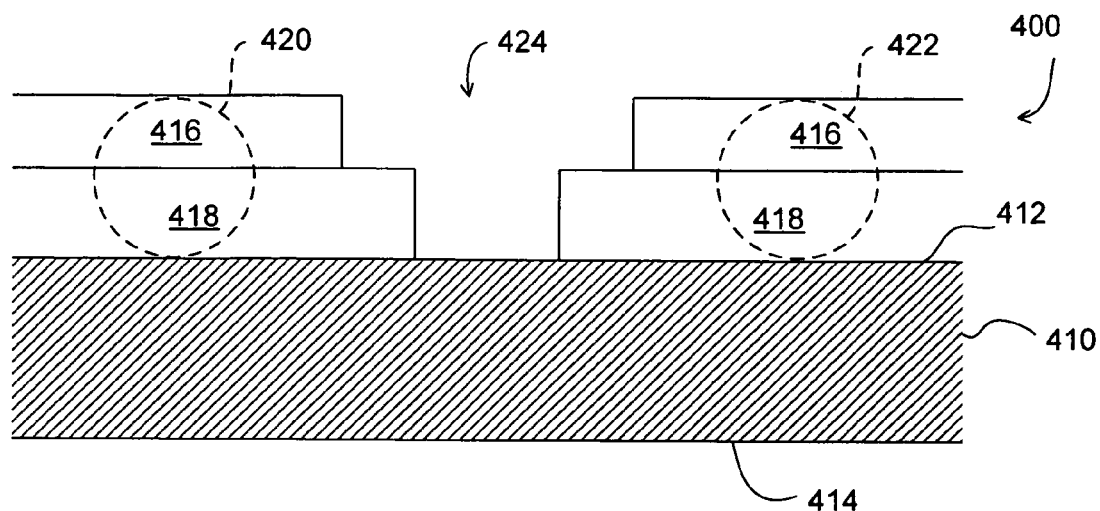
FIGS. 4A-4G are side view schematics of a portion of an exemplary semiconductor work piece that is thinned and cut according to the process shown in FIG. 3.

As represented by dashed lines in FIG. 4A, in this example, a first IC area 420 and a second IC area 422 are formed in the layers 416, 418. The first IC area 420 and the second IC area 422 are separated from one another by a street 424. Although not shown, metallic test structures, low-k dielectrics, or other materials may be formed in the street 424. In one embodiment, the width of the street 424 (e.g., the distance between the first IC area 420 and the second IC area 422) is in a range between approximately 8 μm and approximately 12 μm. However, an artisan will recognize that the street 424 may have other widths. For example, in other embodiments, the width of the street 424 is in a range between approximately 12 μm and approximately 50 μm.

In the manufacturing stage shown in FIG. 4A, the silicon wafer 410 has a thickness (e.g., the distance between the top surface 412 and the first bottom surface 414) in a range between approximately 250 μm and approximately 1000 μm. As discussed above, to thin the silicon wafer 410, the bottom surface 414 is ground until a desired thickness is reached.

Figure 4B:
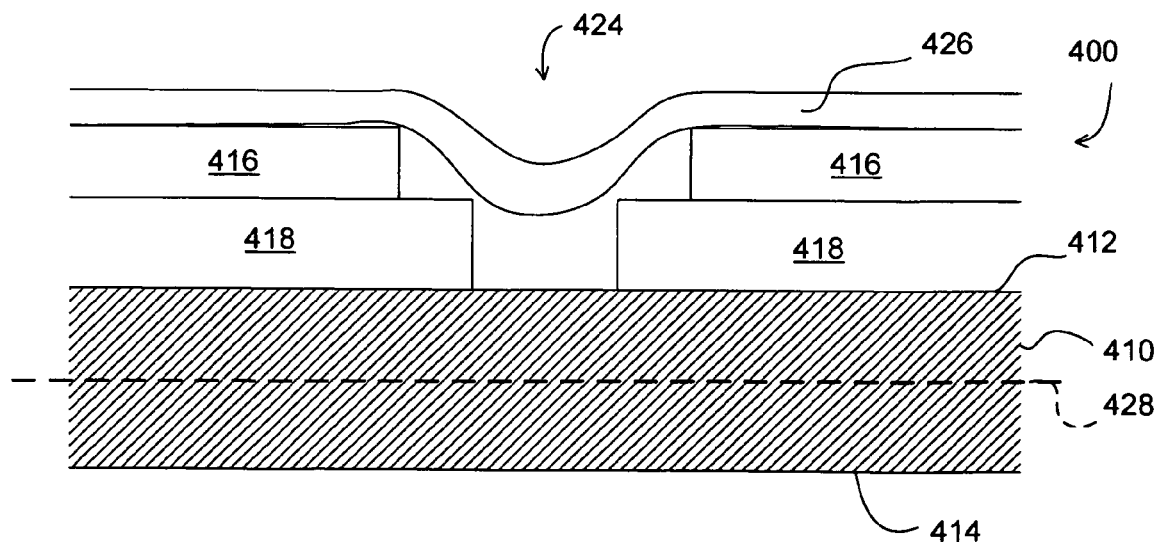

As shown in FIG. 4B, grinding tape 426 is applied over the top surface 412 and the layers 416, 418 The grinding tape 426 protects the first IC area 420 and the second IC area 422 while the silicon wafer is thinned by grinding the first bottom surface 414 using, for example, a grinding machine. The grinding tape 426 is transparent to infrared light. Suitable back side grinding tape is available from, for example, Furukawa Electric Co., LTD. of Tokyo, Japan, Lintec Corp. Advanced Materials Div. Of Tokyo, Japan, and Toyo Adtec Co., LTD. of Kamakura, Japan. In one embodiment, the grinding tape 426 is substantially transparent to infrared light with wavelengths ranging between approximately 1.2 μm and approximately 1.3 μm. As discussed below, the silicon wafer 410 is also substantially transparent to these wavelengths.

The first bottom surface 414 is ground until a desired reduced thickness (represented by dashed line 428 in FIG. 4B) is achieved. As shown in FIGS. 4C-4G, the grinding process produces a second bottom surface 430. After grinding, the silicon wafer has a reduced thickness in a range between approximately 50 μm and approximately 200 μm. If the top surface 412 and the second bottom surface 430 are substantially smooth, it is easier to image the street locations using infrared light. Thus, in certain embodiments, the grinding process is followed by additional processes known in the art to smooth the second bottom surface 430.

Figure 4C:
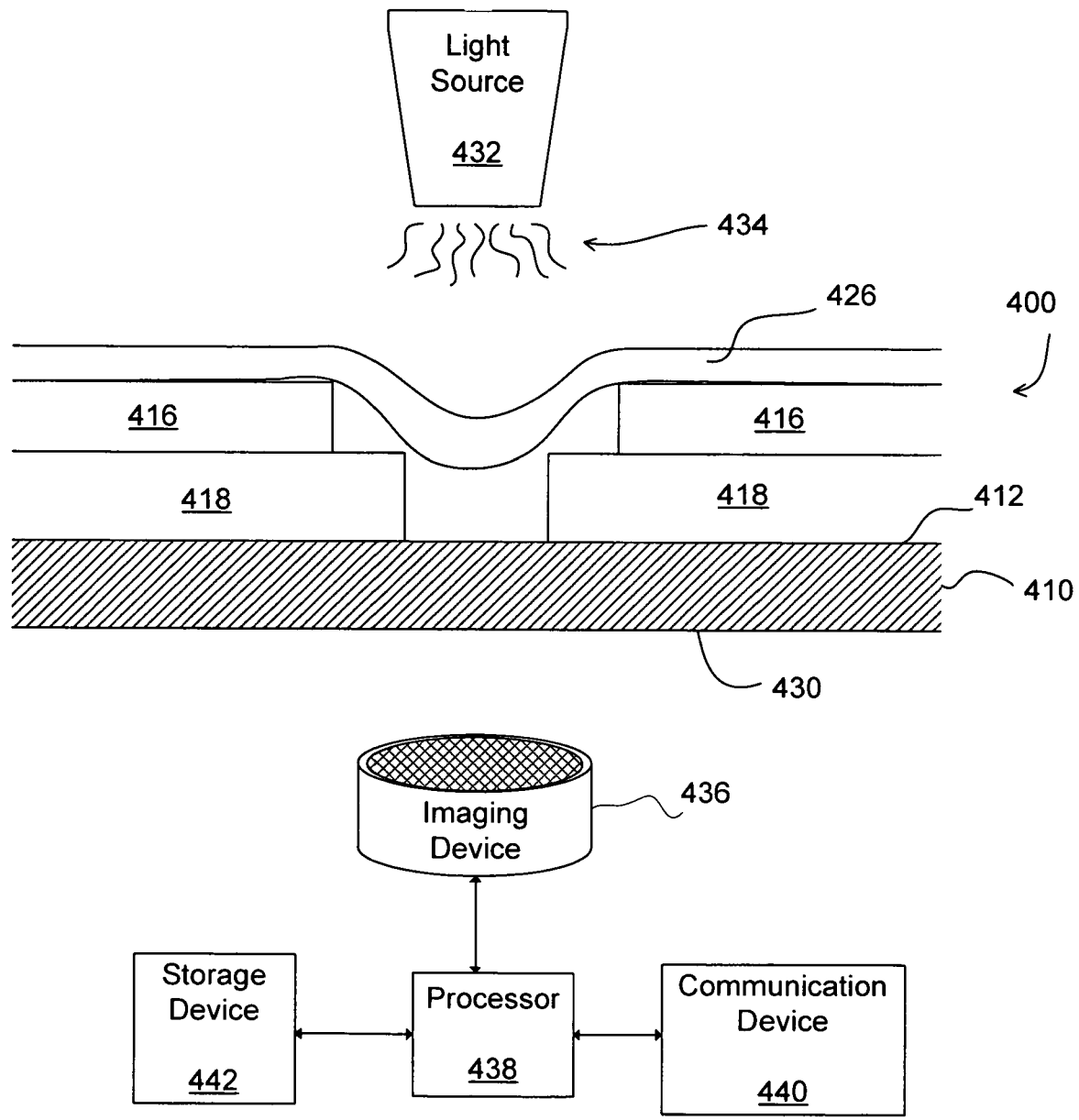

After grinding the silicon wafer 410 to the desired thickness, the location of the street 424 is mapped with respect to the second bottom surface 430 so that the second bottom surface 430 can be scribed along the street 424. As shown in FIG. 4C, an infrared light source 432 is configured to flood a portion of the grinding tape 426, the layers 416, 418 and the silicon wafer 410 with diffuse infrared light 434. The light source 432 may include, for example, an infrared light-emitting diode (LED) configured to generate infrared light in a desired band. Although not shown, a filter may also be used to reduce the range of wavelengths produced by the light source 432 to the desired band.

The wavelength of the infrared light 434 is selected so as to provide sufficient transparency through the grinding tape 426 and the silicon wafer 410. The silicon wafer 410 tends to absorb shorter wavelengths. However, longer wavelengths may reduce the resolution such that the street 424 is not detectable from the back side of the silicon wafer 410. In one embodiment, the wavelength is in a range between approximately 1.2 µm and approximately 1.3 µm.

The intensity of the infrared light 434 is sufficient to be detectable by an imaging device 436 positioned on the opposite side of the silicon wafer 410. The imaging device 436 may include a CCD or CMOS camera configured to detect the infrared light after it passes through the grinding tape 426 and the silicon wafer 430. For example, the imaging device 436 may include a Germanium or InGaAs CCD. In one embodiment, the imaging device 436 comprises an Alpha NIR camera available from FLIR Systems, Indigo Operations of Goleta, Calif.

As shown in FIG. 4C, the imaging device 436 is in communication with a processor 438, such as a microprocessor, a digital signal processor, or the like. The processor 438 controls the operation of the imaging device 436. The processor 438 executes software stored in a storage device 442 so as to perform various tasks discussed herein such as scanning the second bottom surface 430, generating image data, and processing the image data so as to map a location of the street 424. The processor 438 may be in communication with a communication device 440 so as to send and/or receive image data and/or mapped street locations.

The field of view of the imaging device 436 is selected so as to provide sufficient resolution to detect the street and is matched to the area flooded by the infrared light 434. In one embodiment, the imaging device 436 has a field of view in a range between approximately 450 µm and approximately 550 µm. As discussed above, the infrared light source 432 and the imaging device 436 may be scanned over the work piece 400 and the scanned images can be combined to generate an overall image of the infrared light 434 passing through the second bottom surface 430. The overall image is used to map the location of the street 424 with respect to the second bottom surface 430. As discussed above, pattern recognition such as a Hough transforms or another image processing technique is used in one embodiment to determine whether line segments in various portions of the overall image are part of a longer straight line of the street 424. In another embodiment, a user maps the street locations by visually locating the street locations on an image created by the imaging device and entering the street locations into the processor 438 for storage in the storage device 442. The stored street locations are then used to generate a scribe map for subsequent cutting of the bottom surface of the wafer.

Figure 4D:
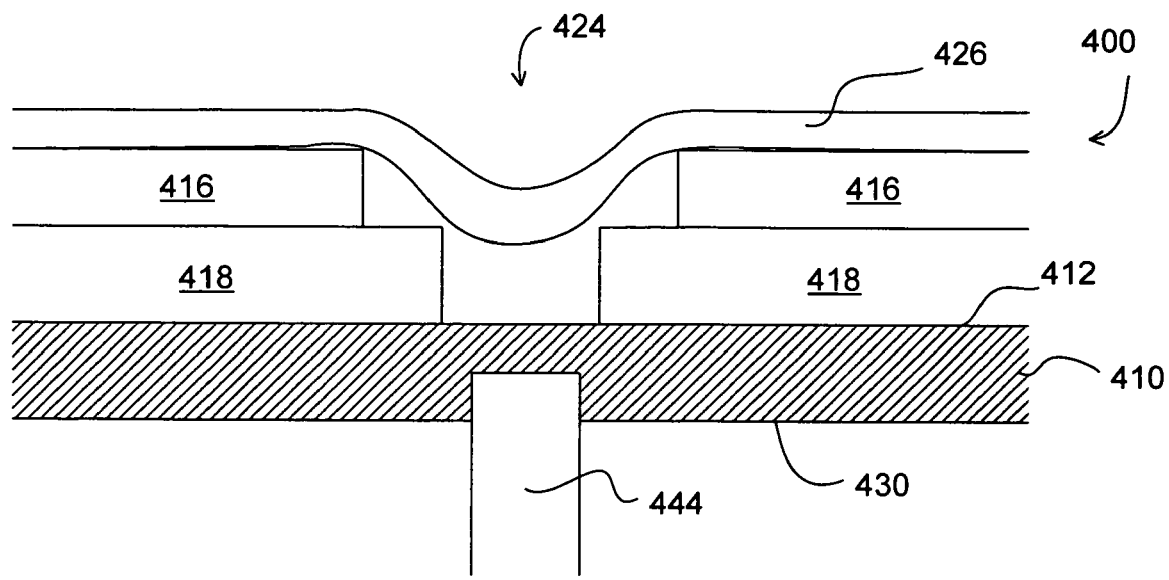

After the location of the street 424 has been mapped with respect to the second bottom surface 430, the second bottom surface 430 is cut along the street 424. FIG. 4D illustrates a mechanical saw blade 444 cutting a kerf into the second bottom surface 430 in a location corresponding to the street 424. An artisan will also recognize that a laser can be used instead of a saw to ablate the second bottom surface 430 of the silicon wafer 410. However, if the laser cutting is performed while imaging is also performed, the image of the second bottom surface 430 may include speckles produced by the laser that may make it more difficult to determine the location of the street 424. Thus, in applications where part of a wafer is imaged while another part of the wafer is cut, it is preferable to use a dicing saw. However, an artisan will recognize that image processing techniques can be used to remove speckles from the image to facilitate concurrent imaging and laser cutting. Further, in one embodiment, the location of the street 424 is mapped before the laser is activated. Thus, the image of the second bottom surface 430 does not include speckles produced by the laser. Once the street 424 is mapped, the location information is stored and the light source 432 is turned off. The second bottom surface 430 can then be cut by the laser along the street 424.

During the cutting process, the grinding tape 426 remains over the layers 416, 418 and the top surface 412 of the silicon wafer 410 so as to protect the IC areas 420, 422 from debris. The grinding tape 426 also holds the work piece 400 in place during and after the cutting.

Figure 4E:
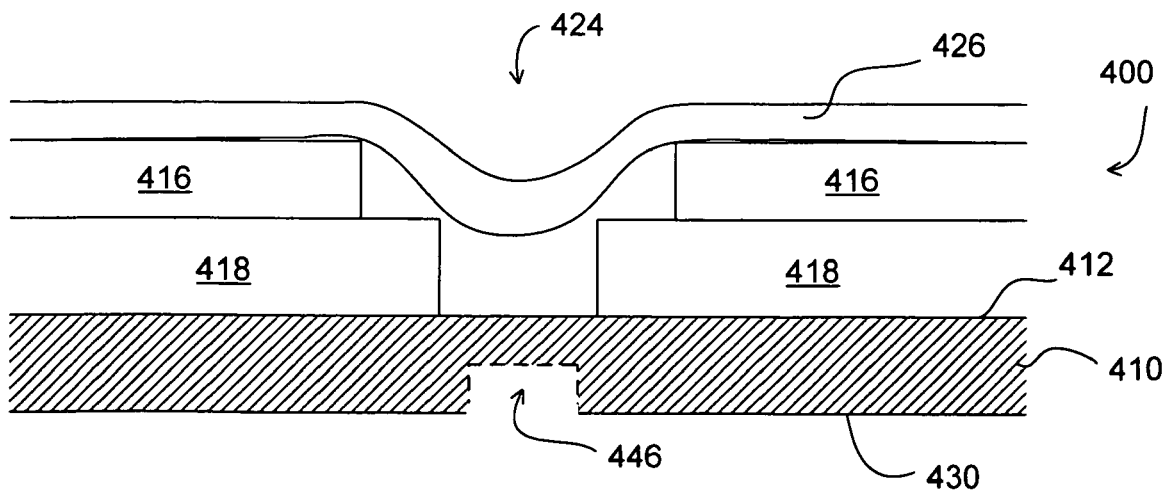
Figure 4F:
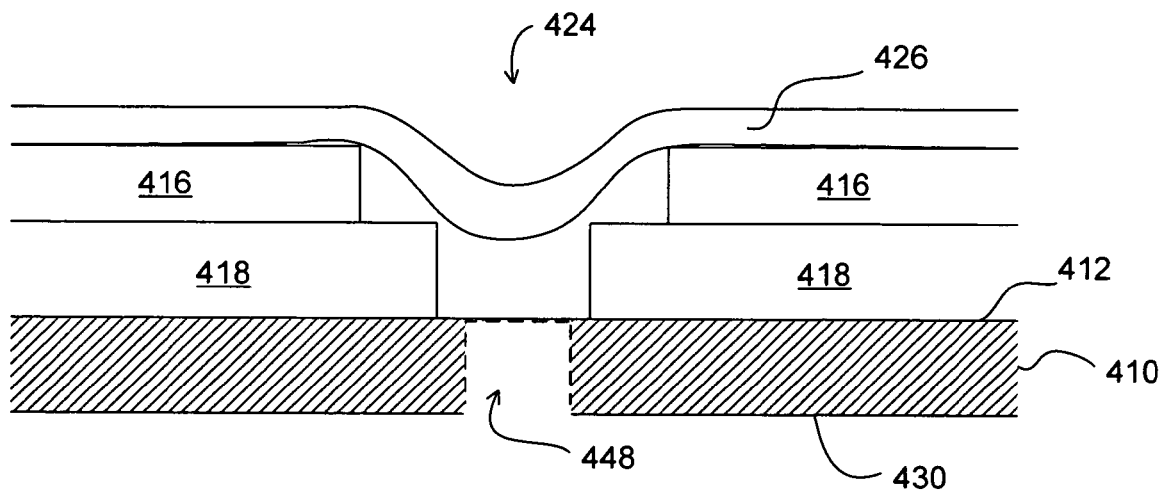

As shown in FIGS. 4D-4F, the second bottom surface 430 is scribed in certain embodiments so as to avoid contact between the saw blade 444 and any metallic test structures, low-k dielectric material, or other materials that may be located above the top surface 412 of the silicon wafer 410 in the area of the street 424. Thus, damage to the IC areas 420, 422 and/or the saw blade 444 is eliminated or reduced during the scribing process. The second bottom surface 430 may be scribed to different depths, depending on the application. For example, FIG. 4E illustrates a scribed portion 446 extending approximately half way between the second bottom surface 430 and the top surface 412. As another example, FIG. 4F illustrates a scribed portion 448 extending substantially to the top surface 412.

Figure 4G:
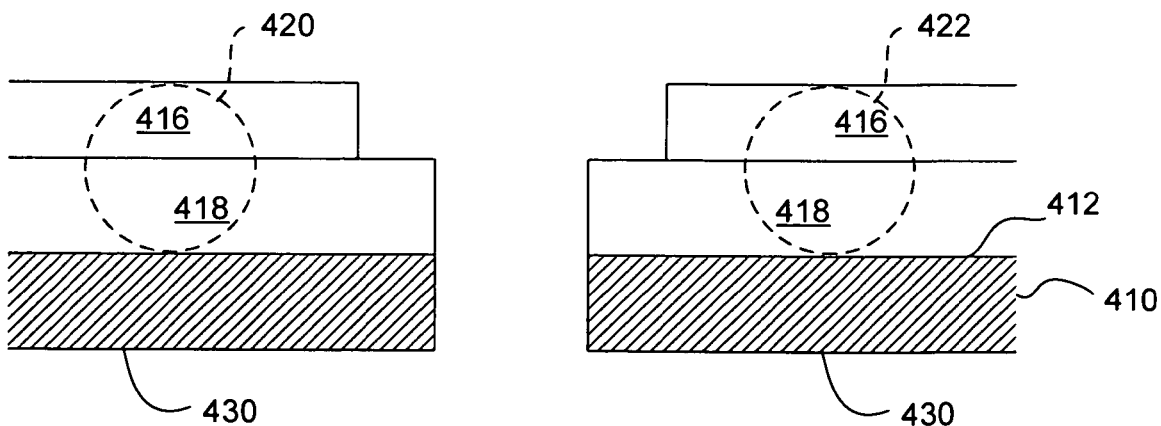

As shown in FIG. 4G, the first IC area 420 and the second IC area 422 can then be completely diced and removed from the grinding tape 426 for individual packaging. After scribing, the first IC area 420 and the second IC area 422 may be diced, for example, by breaking the silicon wafer 410 along the scribed lines. Thus, by detecting street locations with respect to the back side of the wafer 410 and cutting the back side of the wafer 410 along the street locations, debris and chipping in the first IC area 420 and the second IC area 422 can be reduced or eliminated.

It will be obvious to those having skill in the art that many changes may be made to the details of the above-described embodiments without departing from the underlying principles of the invention. For example, the back side of the wafer can be cut without first thinning the wafer. As another example, other wafer materials besides silicon and other light sources with different wavelengths can be used. However, substrates such as ceramics or the like are generally non-homogeneous, making it more difficult to image light passing through them. Thus, while non-homogeneous wafer materials can be used, substantially homogenous materials such as silicon are preferred.

As yet another example, the grinding tape is not transparent to the light used for imaging. Rather, according to one embodiment, the grinding tape includes cut outs or transparent windows corresponding to the streets and/or street intersections. In such embodiments, illumination through the cut outs or windows is detected from the backside of the wafer to indicate the street locations. Thus, a cutting tool can then be aligned to the streets from the back side of the wafer.

The scope of the present invention should be determined only by the following claims.

What is claimed is:

1. A method of cutting a semiconductor wafer having a plurality of integrated circuits formed on or in a top surface thereof, the integrated circuits separated by one or more streets visible from the top surface of the semiconductor wafer, the method comprising:

illuminating the top surface of the semiconductor wafer with a light, a portion of the light passing through the one or more streets to a bottom surface of the semiconductor wafer;

imaging the portion of the light passing from the bottom surface of the semiconductor wafer so as to determine a location of the one or more streets relative to the bottom surface of the semiconductor wafer; and cutting, from the bottom surface toward the top surface, a portion of the bottom surface of the semiconductor wafer corresponding to the location of the one or more streets.

2. The method of claim 1, further comprising performing pattern recognition on an image of the portion of the light to detect a line corresponding to a street.

3. The method of claim 2, wherein performing the pattern recognition comprises performing a Hough transform.

4. The method of claim 1, wherein cutting the portion of the bottom surface comprises scribing a line on the bottom surface.

5. The method of claim 4, further comprising breaking the semiconductor wafer into separate pieces along the scribed line.

6. The method of claim 1, wherein cutting the portion of the bottom surface comprises scribing the bottom surface with a saw.

7. The method of claim 1, wherein cutting the portion of the bottom surface comprises scribing the bottom surface with a laser.

8. The method of claim 1, wherein the semiconductor wafer comprises silicon.

9. The method of claim 8, wherein the light comprises infrared light.

10. The method of claim 9, wherein the wavelength of the light is in a range between approximately 1.2 μm and approximately 1.3 μm.

11. The method of claim 1, wherein the light is configured to pass through a protective layer over the top surface of the semiconductor wafer.

12. The method of claim 11, wherein the protective layer comprises grinding tape.

13. The method of claim 11, wherein the light passes through holes cut in the protective layer over the top surface of the semiconductor wafer.

14. A system for cutting a semiconductor wafer having a plurality of integrated circuits formed on or in a top surface thereof, the integrated circuits separated by one or more streets visible from the top surface of the semiconductor wafer, the system comprising:

a light source to illuminate the top surface of the semiconductor wafer with light, a portion of the light passing through the one or more streets to a bottom surface of the semiconductor wafer;

an imaging device to image the portion of the light passing from the bottom surface of the semiconductor wafer so as to determine a location of the one or more streets relative to the bottom surface of the semiconductor wafer; and a cutting device to cut a portion of the bottom surface of the semiconductor wafer corresponding to the location of the one or more streets, the cutting device configured to cut from the bottom surface toward the top surface.

15. The system of claim 14, further comprising a processor to perform pattern recognition on an image of the portion of the light to detect a line corresponding to a street.

16. The system of claim 15, wherein performing the pattern recognition comprises performing a Hough transform.

17. The system of claim 14, wherein cutting the portion of the bottom surface comprises scribing a line on the bottom surface.

18. The system of claim 14, wherein the cutting device comprises a saw, and wherein cutting the portion of the bottom surface comprises scribing the bottom surface with the saw.

19. The system of claim 14, wherein the cutting device comprises a laser, and wherein cutting the portion of the bottom surface comprises scribing the bottom surface with the laser.

20. The system of claim 14, wherein the semiconductor wafer comprises silicon.

21. The system of claim 20, wherein the light comprises infrared light.

22. The system of claim 21, wherein the wavelength of the light is in a range between approximately 1.2 μm and approximately 1.3 μm.

23. The system of claim 14, wherein the light is configured to pass through a protective layer over the top surface of the semiconductor wafer.

24. The system of claim 23, wherein the protective layer comprises grinding tape.

25. The system of claim 23, wherein the light passes through holes cut in the protective layer over the top surface of the semiconductor wafer.

26. A system for cutting a semiconductor wafer having a plurality of integrated circuits formed on or in a top surface thereof, the integrated circuits separated by one or more streets visible from the top surface of the semiconductor wafer, the system comprising:

means for illuminating the top surface of the semiconductor wafer with light, a portion of the light passing through the one or more streets to a bottom surface of the semiconductor wafer;

means for imaging the portion of the light passing from the bottom surface of the semiconductor wafer so as to determine a location of the one or more streets relative to the bottom surface of the semiconductor wafer; and means for cutting a portion of the bottom surface of the semiconductor wafer corresponding to the location of the one or more streets, the cutting means cutting from the bottom surface toward the top surface.

27. The system of claim 26, further comprising means for performing pattern recognition on an image of the portion of the light to detect a line corresponding to a street.

28. The system of claim 27, wherein performing the pattern recognition comprises performing a Hough transform.

29. The system of claim 26, wherein cutting the portion of the bottom surface comprises scribing a line on the bottom surface.

30. The system of claim 26, wherein the light comprises infrared light.

31. The system of claim 26, wherein the wavelength of the light is in a range between approximately 1.2 μm and approximately 1.3 μm.

* * * * *